(12) United States Patent
Tofts et al.

(10) Patent No.: US 7,958,072 B2
(45) Date of Patent: Jun. 7, 2011

(54) METHOD AND APPARATUS FOR CALCULATING REQUIRED AVAILABILITY OF NODES IN A TREE STRUCTURE

(75) Inventors: Chris Tofts, Bristol (GB); Richard Taylor, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 1353 days.

(21) Appl. No.: 11/490,946

(22) Filed: Jul. 21, 2006

(65) Prior Publication Data

US 2007/0101181 A1    May 3, 2007

(30) Foreign Application Priority Data

Oct. 28, 2005 (GB) .................................. 0521992.8

(51) Int. Cl.
*G06F 17/00* (2006.01)

(52) U.S. Cl. ........................................................ 706/45

(58) Field of Classification Search .............. 706/45–47; 709/223–226; 714/100, 1, 47
See application file for complete search history.

(56) References Cited

U.S. PATENT DOCUMENTS

| | | | | |
|---|---|---|---|---|
| 5,361,347 | A | 11/1994 | Gilder et al. | 714/44 |
| 5,881,268 | A * | 3/1999 | McDonald et al. | 703/21 |
| 6,747,957 | B1 | 6/2004 | Pithawala et al. | 370/252 |
| 7,467,192 | B1 * | 12/2008 | Lemler et al. | 709/223 |
| 2004/0153558 | A1 * | 8/2004 | Gunduc et al. | 709/229 |
| 2004/0158575 | A1 | 8/2004 | Jacquemot et al. | 707/102 |
| 2005/0113098 | A1 * | 5/2005 | Cankaya et al. | 455/446 |
| 2005/0204333 | A1 * | 9/2005 | Denby et al. | 717/104 |
| 2007/0226359 | A1 * | 9/2007 | Gunduc et al. | 709/229 |

FOREIGN PATENT DOCUMENTS

GB    0521992.8    12/2005

OTHER PUBLICATIONS

Eshuis et al., Verification Support for Workflow Design with UML Activity Graphs, 2002, ACM, 1-58113-472-X/02/0005, pp. 166-176.*
Arpaci-Dusseau, Performance Availability of Networks of Workstations, 1999, Univesity of California, pp. 1-155.*
Baudin et al., From Spreadsheets to Simulations: A comparison of Analysis Methods For IC Manufacturing Performance, 1992, IEEE, pp. 94-99.*
Tofts, C., et al., "Compiling Reliability Models to Excel," *HP Laboratories Bristol* pp. 1-38, Apr. 2004.

* cited by examiner

*Primary Examiner* — David R Vincent

(57) ABSTRACT

A method of system design and manufacture includes entering system details in a first user interface program 100, including in particular availability data. A transfer file 110 defining a spreadsheet including cells representing the system is created and transferred to a spreadsheet 120. The spreadsheet calculates both the availability and target availability of the components. The transfer file is arranged to define component count spreadsheet cells to permit user input to vary the numbers of at least some components of the system, and calculation cells to calculate the properties of the system for the component counts entered into the component count cells. The user can then adjust the spreadsheet to obtain a desired result, output the final configuration as output file 130 and pass the file to a manufacturing facility 140 to produce the designed system. The system designed and manufactured may be a computer system with many components.

19 Claims, 2 Drawing Sheets

METHOD AND APPARATUS FOR CALCULATING REQUIRED AVAILABILITY OF NODES IN A TREE STRUCTURE

CLAIM FOR PRIORITY

This application claims the benefit of foreign priority under 35 U.S.C. 119 to U.K. Patent Application No. GB 0521992.8, entitled "System Design and Manufacture" by Tofts, et al., filed on Oct. 28, 2005, the disclosure of which is hereby incorporated by reference in its entirety.

As technological complexity increases, the complexity of systems that must be delivered to customers in many fields of industry continues to increase. The increasing complexity of such systems means that it is increasingly difficult to design them economically by one individual using a sheet of paper, and this results in an increasing reliance on computers to assist in the design.

A particular case in point is complex computer systems that may be made up of many components such as disk drives, processors, input-output devices and many more. The number of such components can be large. The number of components is normally not known in advance. Instead, users require a system with particular processing power, input output and availability requirements and require the cheapest design that will meet these targets.

The design of such systems involves many trade-offs. For example, redundancy can be built in to increase availability. Alternatively, more reliable or better specified components can be used. It is very difficult to calculate the trade-off between these two possibilities of improving the availability of the system.

It is not usually practical to design such systems by carrying out calculations using off-the shelf packages, such as spreadsheets. If each component requires a line of data in the spreadsheet, the number of lines of data that need to be checked as they are entered in the spreadsheet can be very large and this leads to mistakes being made and hence unsatisfactory results.

Instead, the inventors have previously developed proprietary software for inputting information regarding systems and calculating various figures of merit for them such as cost and availability which has been used internally for designing and specifying computer systems for manufacture.

However, such proprietary systems have the disadvantage that it is difficult for untrained individuals such as customers to understand or appreciate the results, or understand how changing some requirements can lead to different results.

A particular difficulty is the problem of determining where changes need to be made to meet target requirements. If an initial design with many components does not deliver the required availability or data processing capability, it can be very difficult to know where the design needs to be changed to deliver the requirements. It can also be difficult to know where the design can be modified to reduce cost with little adverse consequence to the requirements specified.

There is accordingly a need for a process that more readily delivers manufactured designs meeting system targets.

According to the invention there is provided a method of creating a complete system, comprising:
(a) entering system details regarding the components of the system and the availability of the respective components;
(b) entering system details defining the interrelationship of the components of the complete system as a tree structure of nodes with the complete system as the parent node, and the components as child component nodes, the child component nodes being grouped into sub-systems represented as intermediate nodes between the parent node and the child component nodes;
(c) calculating the availability of each node in the tree structure from the entered details starting at the child component nodes and working back to the parent node;
(d) entering a required availability figure for the complete system and ascribing it to the parent node;
(e) calculating the required availability of nodes in the tree structure, starting at the parent node and calculating the required availability of each sub-node of a node by calculating the required availability of each sub-node to obtain the required availability of the node on the assumption that each sub-node is equally reliable, and repeating the calculation until the required availability is calculated for a plurality of the nodes; and
(f) outputting the calculated availability and required availability of the plurality of the nodes.

The improvement in system design capabilities allows improved systems to be designed and manufactured rapidly and in an intuitive way. In particular, by outputting both a "required availability" figure as well as an "availability" figure it is possible for the engineer to assess where improvement is likely to be required to deliver required targets.

In a preferred embodiment, the spreadsheet is Microsoft EXCEL®. The transfer file may be an XML file.

For a better understanding of the invention embodiments will now be described, purely by way of example, with reference to the accompanying drawings, in which.

Figure 1:
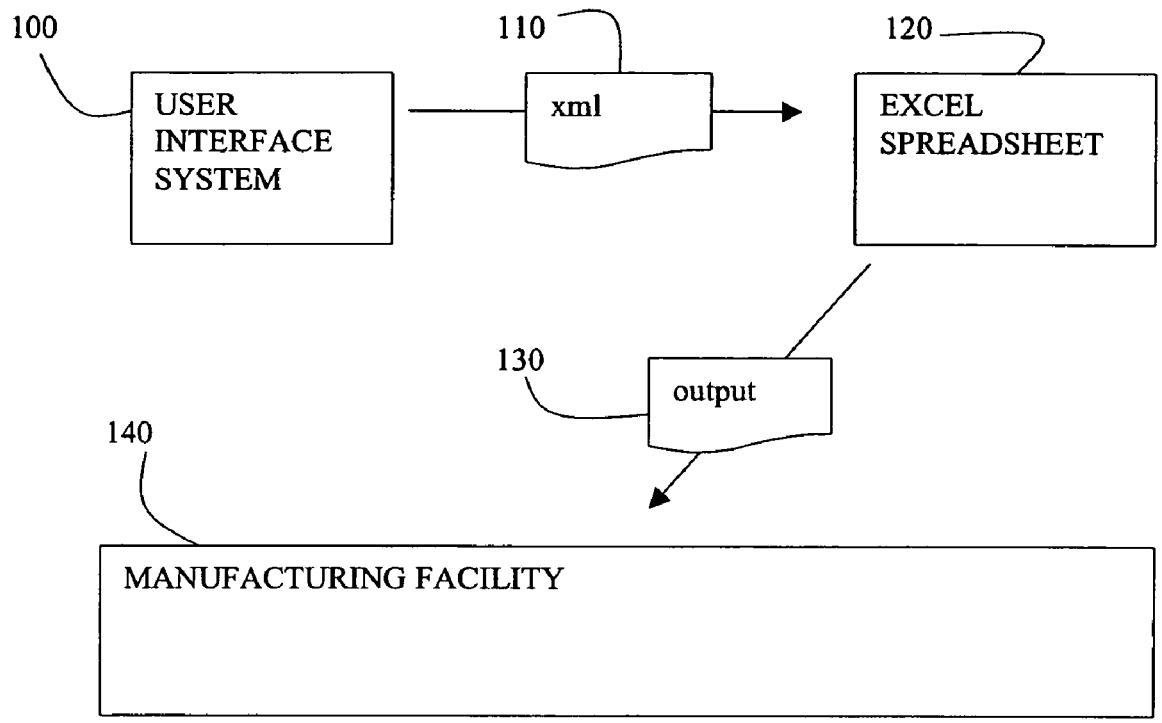
FIG. 1 illustrates a system according to an embodiment of the invention.

The first embodiment of the invention relates to a method of designing and manufacturing a computer system with a number of components.

A user interface system 100 is provided which accepts text input in the form of operators.

The operators define both the components of the system and the way they interreact.

A first operator is the component operator that defines a component of a computer system as a node:
component (name, [, ref name], mttf, mttr), where name is the name of the node, mttf is the mean time to failure, mttr is the mean time to recovery, and refname is an optional name used to refer to this node as will be explained below.

Thus, the component operators represent availability information which define the reliability of the components.

Such components are grouped in subsystems which are also represented by nodes. Various operators may be used depending on how each subsystem's reliability depends on the nodes.

If the subsystem requires all nodes within it to work, the operator is:
and (name, [, ref name], sc1, . . . scn) is used. Again, name is the name of the node. The and operator defines a list of n subcomponents sc1 . . . scn: all must work for the node to work.

Alternatively, a subsystem may be configured so that it works if any of its component nodes are working. In this case, the operator is:
or (name, [, ref name], sc1, . . . scn). Again, name is the name of the node. The or operator defines a list of n subcomponents sc1 . . . scn any one of which must work for the node to work.

Another operator is available in case some subcomponents are required. In this case, the operator is:

from (name, [, ref name], limit, sc1, . . . scn). Again, name is the name of the node. The from operator defines a list of n subcomponents sc1 . . . scn of which the number limit must work for the node to work.

In the case that one component can substitute for another after a certain time, a further operator is available:

hotswap (name, [, ref name], swapTime, sc1, . . . scn). Again, name is the name of the node. The hotswap operator defines a list of n subcomponents sc1, . . . scn which can be substituted for one another after a time swapTime.

Two further operators allow multiple instances of a type of node:

ref (name, refName) means that the node of this operator, labelled name, is live (works) when the node refName is. Thus, ref is a cross reference operator.

To create copies, the operator:

copy (name, refName) means that the node is a copy of the node refname. This differs from ref since copy is another instance of the node copied. The node of the copy operator is not simply another reference to a node but another instance of a node which may be in operation or not independently of the node referred to.

To take a very simple example, a complete system, labelled "system" that only worked when a processor node and a memory node both worked could be coded:

```
and (system,
    component (processor, 10000, 2),
    component (memory, 5000,1)
    )
```

The processor component has a mean time to failure of 10000 hours and takes 2 hours on average to replace and the memory component has a mean time to failure of 5000 hours and takes 1 hour to replace.

Figure 3:
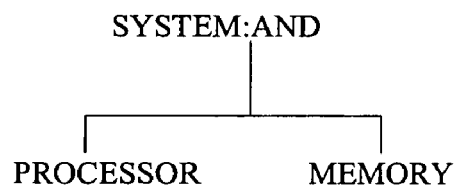
FIG. 3 is an illustration of a simple system designed and manufactured with the embodiment.
Figure 2:
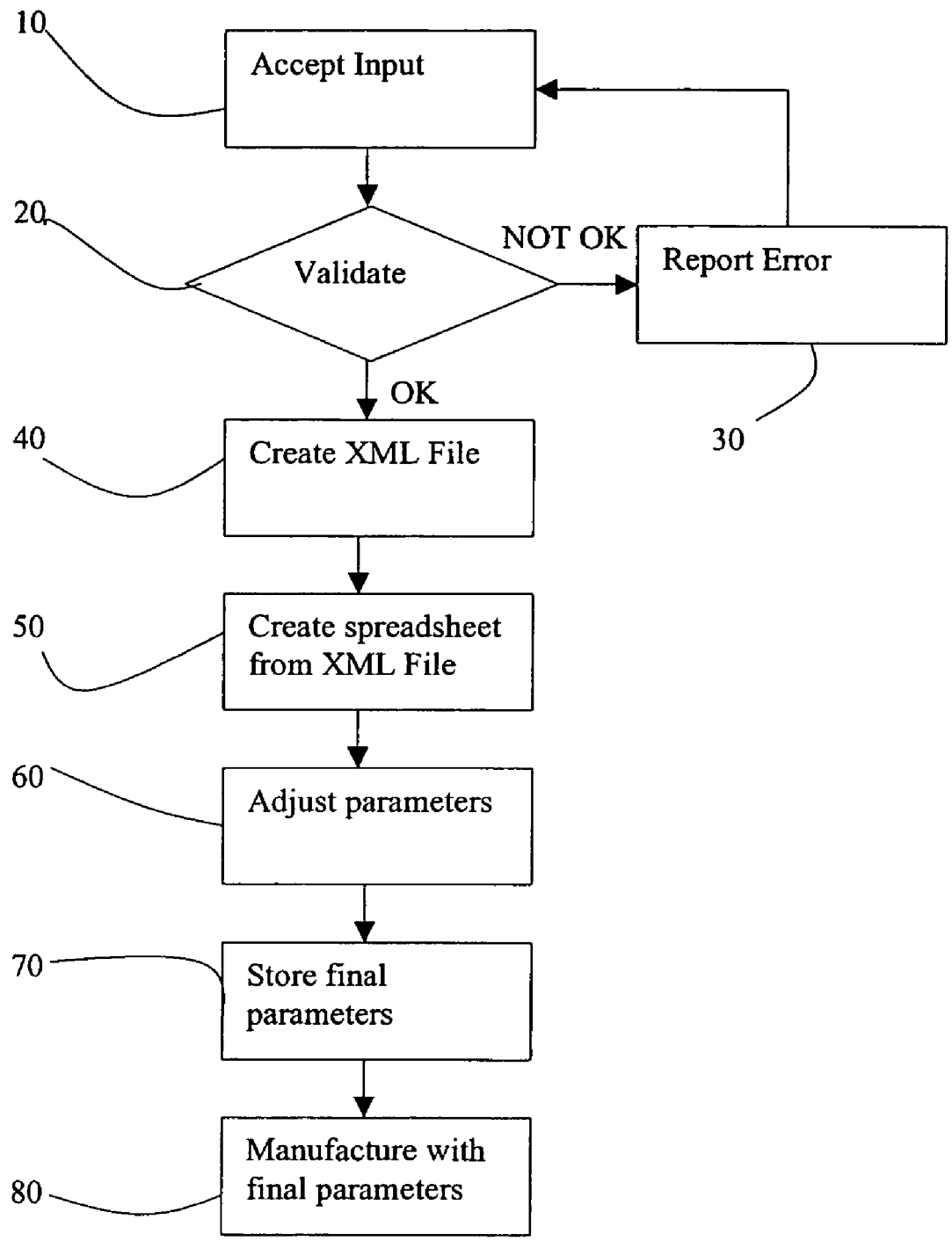
FIG. 2 illustrates a flow diagram of a method according to an embodiment of the invention.

The system works only when both the processor and memory work. This system is illustrated schematically in FIG. 3, wherein the complete system is at the top of a tree and an "AND" operator connects the complete system to the processor and memory. As will be appreciated, real systems are a lot more complex than this.

In the first embodiment of the invention, the structure of the system to be designed is entered using these operators in text format. The operators "and", "or", "from", and "hotswap" define the system structure as a set of system structure information. The "copy" and "ref" operators can define system structure details when used to refer to or copy "and", "or", "from" and "hotswap" nodes, and can also define component reliability details when used to refer to or copy component nodes.

The first step of the method is accordingly to enter (step 10) the user data into the user interface system 100 using these operators. The entered data conceptually forms a tree structure. The leaves of the tree are the components, which are grouped together in sub-systems and in turn make up the complete system.

Next, (step 20), the user interface system 100 validates the data and reports (step 30) any apparent anomalies that are detected to allow the user to return to step 10 to correct the data.

Once the data has been validated, the user interface system 100 creates an xml file 110 defining an Excel spreadsheet (step 40). The spreadsheet thus created will be described in more detail below.

Note that the spreadsheet created is a native Excel spreadsheet to obtain suitable processing speed, not a spreadsheet using VBA or other add-on system for carrying out calculations. The calculation cells are simply entered cells in the spreadsheet, in closed form.

The XML file 110 is then transferred to EXCEL spreadsheet 120 (step 50). This transfer process is performed by an inherent capability within the EXCEL program, it being capable of opening an XML file and displaying it in spreadsheet form without intervention on the part of a user. Once expressed visually as a spreadsheet—a form more readily assimilable by those who may be required to evaluate a model of a system (as contrasted with those who can create the model), a user can easily adjust the parameters to obtain, via the calculations performed by EXCEL suitable availability and reliability (step 60) values.

When the user is happy, the final parameters of the input cells are then stored in output file 130 (step 70).

This is passed to a manufacturing facility 140 where a system according to the details in output file 130 is created (step 80).

In this way a system can be manufactured and designed.

The power of this method can be seen by studying a simple example. A simple system can be specified as follows:

computer=component (10000,1)
network=component (20000,1)
compSys=and (computer, computer)
netSys=or (network,network)
Sys=and (compSys,netSys)

The expression of a system, defined above in a relatively natural syntax, in XML syntax results in an XML file which is illustrated in Appendix 1 hereto, from which it can be seen that even the specification of simple systems result in significant level of complexity when expressed in certain forms; in the present case XML, since this is a form which is directly assimilable by EXCEL.

The process by which a system as expressed in the above notation is converted into an XML file is described comprehensively in Appendix 2, and for the sake of brevity and clarity of concept will not be addressed further in the main body of this specification.

In the spreadsheet, a row is assigned to each node. Columns are set aside for: availability, mean time to restore, mean time to failure (mttf), mean time to repair (mttr) and mean time to attend (mtta), the latter three columns only being used for nodes representing components, not nodes representing subsystems.

Importantly, the data is not calculated in the user interface system 100 but instead calculation cells are introduced into the spreadsheet to calculate the data items. This allows the spreadsheet parameters to be changed and the spreadsheet then calculates the changed reliability.

For example, for a component, a calculation cell is used that calculates availability from the mttf, mtta and mttr values. Representing the availability value in the nth row as AV(N), and using a like form for the mttf, mttr and mtta values, the availability can be calculated by a cell in the row of a component coding $AV(N)=MTTF(N)/(MTTF(N)+MTTR(N)+MTTA(N))$. Similar calculations can automatically be carried out for the other operators.

In rows representing subsystems made up of individual components or further sub-systems, the availability values are calculated from the availability values of those individual components or further sub-systems.

As an example, consider a FROM operator as the Nth row with identical sub-components N1 . . . NK. In this case, AV(N)=BINDIST (K-LIMIT,K,AV(N1),1), where BINDIST is the EXCEL binomial distribution function.

This example shows a power of the approach used, namely that complex Excel functions (BINDIST) can be used which execute very quickly.

One difficulty when designing large systems is to know where changes might usefully be made to meet system requirements. It can often be the case that an initial attempt at a design does not meet reliability requirements, and changes need to be made to meet them, but it is very hard to know which parameters could be most usefully changed. Alternatively, a system may exceed reliability requirements but changes to reduce cost may be desired—again, it is difficult to know where changes might most usefully be made, and which of the many parameters in a large model should be varied.

Accordingly, the compiler creates an additional column for each node, i.e. an additional column for each row, which in the embodiment is labelled target availability. The embodiment then colour codes the cells of the spreadsheet, green for those cells for which the availability exceeds the target availability by more than a specific margin, settable in the, red for those cells that fall short of the target availability by the specific margin, and yellow for those cells that are within the margin of the target availability.

The embodiment requires the target availability for each node. This is done by dividing up the required availability evenly. For example, consider a system which requires each of three sub-systems to work, namely a processor, a memory and an input-output (io) unit. Suppose the required availability is 97%.

The system assigns a required availability to each of the three sub-systems by dividing up the unreliability. Thus, in the present case, the system can achieve the required availability by requiring the availability of each sub-system to be 99%.

Assuming that the availability for the processor node is 99.5%, for the memory 99% and for the io node 97%.

The spreadsheet created will therefore have the following rows

|  | Required Availability | Availability |
|---|---|---|
| Complete System | 0.97 | 0.955 |
| Processor | 0.99 | 0.995 |
| Memory | 0.99 | 0.99 |
| I/O | 0.99 | 0.97 |

The rows for the complete system and I/O are coloured red, to indicate unsatisfactory availability, the row for the processor is coloured green, to indicate good availability, and the row for the memory is coloured yellow, to show acceptable availability.

The user then knows that the I/O node is the most important node to adjust to achieve the required availability, which presently is below the target 97%.

In general such a simple division of requirements evenly is not a good estimate of a sensible way of achieving the goal. However, in the present situation it is a surprisingly good measure, due in part to the non-linear nature of the cost of increasing improved reliability. In general, the closer reliability gets to 1, the harder it is to achieve the increase in reliability.

It should also be noted in the present case that the coding is not intended to automatically make adjustments to improve availability. For this reason, the very crude nature of the estimate is not relevant. Instead, the red rows simply direct the user's attention to those rows that have a disproportionate effect on the availability of the complete system and where the user's effort may accordingly be most usefully directed. In the example, this is obvious to the figures but the information presented in the way shown is much more useful with large systems which might have hundreds of nodes and complex interrelations.

The way in which availability is shared depends on the operator. For example, if the overall availability of a node needs to be (1−e), where e is a small number, an even division of the reliability of an "and" operator with n sub-systems requires each of the sub-systems to have a reliability of (1−e/n). For an "or" operator with n sub-systems, each sub-system requires a reliability of (1−nthroot(e)).

These availabilities are propagated the whole way up the tree so that all sub-systems and components are rated.

The above discussion has focussed on the availability but this is not the only parameter that is calculated. The calculation also calculates at least one further figure of merit for the system, such as cost or processing power.

As for the cost calculation, the compilation also creates two additional rows in the Excel spreadsheet for calculating the cost of the system. One row is used for calculating the fixed cost and one the running cost. The rows simply sum the fixed and running costs of each component. Thus, in the embodiment the definition of each component also includes data with regard to these costs.

It will be appreciated that modifications are possible. For example, the colour coding can be omitted, or alternatively two, four or another number of colour bands are possible.

Note that the embodiment does more than simply generate an EXCEL spreadsheet showing calculated results. The system populates some cells of the spreadsheet with calculations to create calculation cells to allow the user to change some parameters and calculate the results without needing to return to the first system to reenter data and recompile.

The authors are unaware of any other tools that do this. Conventional so-called EXCEL compilers take a spreadsheet entered on EXCEL and compile an executable file to produce the same results without the user needing to own a copy of EXCEL. The present system does the opposite—data is entered on a first system and then transferred to EXCEL to carry out calculations and display results.

The inventors have validated the results obtained for randomly generated systems and have found that the results are excellent, identical results to those calculated by other approaches being found rapidly and efficiently using the spreadsheet.

The approach is highly suitable for the simulation of rare events.

In a second embodiment of the invention, the text entry user interface of the first embodiment is replaced by a graphical user interface 100 which allows the user to design and view a system using a network diagram creating components and entering data without the need to enter the operators, though this remains possible. The second embodiment assists user input. Otherwise, the second embodiment corresponds to the first embodiment.

In a third embodiment, a further refinement is used during the process. Instead of simply recreating the structure of the system input into the original user interface system 100 in the spreadsheet, the compiler process automatically introduces some variability defined by parameters so that the user can adjust the parameters to adjust the structure.

Thus, the EXCEL spreadsheet is in fact more complex than the entered model since the spreadsheet includes input cells to change certain parameters.

In particular, and, or, from and hotswap operators define the relationships between a number of sub-units. In the third embodiment, the compiling process automatically allows a variation in the number of units.

For example, an "or" operator requiring one of three components to work can be entered as or (cluster1, processor1, processor2, processor3). Instead of simply providing a single row for each processor in the spreadsheet, the spreadsheet can be configured to automatically vary the number of processors. A data input cell accepting an integer number of processors is provided, populated initially with the number of processors (three) as in the original design. However, the user can change the data in the data input cell to change the number of processors in an attempt to improve the design.

In a "from" operation, two data input cells may be provided, one for adjusting the number of components which need to work simultaneously for the "from" node to work, and one for adjusting the number of sub-components.

Similar processing can be carried out for a hotswap node.

This allows users with only an understanding of the spreadsheet to adjust model parameters to view the result.

Other features can be added to any of the embodiments. For example, an abstract tree sheet can be provided to give the detail of the main sheet but only up to a certain level, to provide a summary.

A further sheet, or rows, can be used to count components and outage to allow calculation of the spares and maintenance costs of the system.

Although the preferred embodiment of the invention uses a separate data input system 100 and spreadsheet 120 to carry out the calculations, it should be emphasised that this is not essential and in a fourth embodiment a single program is used. The outputs are calculated directly in the single program and output delivered.

The fourth embodiment provides a single system that can deliver good results without the need to transfer data to a spreadsheet.

A problem that occurs is that carrying out calculations for large systems can be slow. In the case of large numbers of components, complex combinatorial calculations are required that can reduce the speed of the user interface system to such an extent that interactive real time use becomes impossible.

The embodiment addresses this issue using a specific computation technique.

Consider the case of an AND operation on eight components s1,s2,s3,s4,s5,s6,s7 and s8 which may be represented as AND(s1,s2,s3,s4,s5,s6,s7,s8).

This is calculated by replacing the AND operator where there are more than three operands with multiple AND operators. The multiple operands are divided into two groups, each group is ANDed and the results of each group are then ANDed. The process is repeated on the resulting groups which may still include AND statements with more than three operands until no further division is possible.

In the example, AND(s1,s2,s3,s4,s5,s6,s7,s8) becomes AND(AND(s1,s2,s3,s4),AND(s5,s6,s7,s8)) which becomes in turn: AND(AND(AND(s1,s2),AND(s3,s4)),AND(AND(s5,s6),AND(s7,s8))).

Thus a single eight operand AND is replaced with seven two-operand AND statements.

The same technique is used with OR operators with more than three operands.

In an example, OR(s1,s2,s3,s4,s5,s6,s7,s8) becomes OR(OR(s1,s2,s3,s4),OR(s5,s6,s7,s8)) which becomes in turn: OR(OR(OR(s1,s2),OR(s3,s4)),OR(OR(s5,s6),OR(s7, s8))).

Exactly the same benefits are obtained.

Further improvement in calculation speed is possible where the operands represent instances of like components. If s1,s2,s3,s4,s5,s6,s7,s8 represent identical components in an identical situation, for example eight memory units connected in parallel, then OR(s1,s2) is the same as OR(s3,s4) etc. Accordingly, the results for each OR operator with like operands are only calculated once to still further improve processing.

A modification to this approach is required for FROM operators.

Consider a requirement for 2n components from 2k components, where n and k are both integers. This may be represented as FROM(2n, s1, s2 ... s2$k$).

An approximation to this is available in the case that n is much less than k.

In this case FROM(2n, s1, s2 ... s2$k$)~AND(FROM(n,s1 ... sk), FROM(n,s(k+1) ... s2$k$).

By using these expansions in the calculation engine of user interface 100 much faster processing is available.

This embodiment uses expansions in the user interface before passing the data to EXCEL for further or additional processing.

In this alternative approach, EXCEL is not used at all, and the calculations are carried out in a single computer using the expansions indicated above. The user can change the modelled structure and numbers of components and calculate the reliability and figure of merit of each modelled structure until a satisfactory solution is obtained. The faster processing available using the expansions above means that the calculations can be carried out sufficiently rapidly for this process to operate satisfactorily interactively.

The invention claimed is:

1. A method of calculating an availability of a system made up of components, said method comprising:
(a) receiving, in a user interface system having a processor, system details regarding the components and an availability of the respective components, wherein the received availability of the respective components is associated with a total operating time without failure of the respective components, which is expressed using at least one of a mean time to failure, a mean time to repair and a mean time to attend associated with the respective components;
(b) receiving, in the user interface system, system details defining the interrelationship of the components as having a tree structure of nodes with the system represented as a parent node, the components as component nodes, and intermediate nodes between the parent node and the child component nodes, wherein the intermediate nodes represent groupings of component nodes;
(c) calculating, by the processor, the availability of the nodes in the tree structure using the received system details with the component nodes as bases for calculating the availability of the intermediate nodes and the parent node;
(d) receiving, in the user interface system, a required availability figure for the system and ascribing it to the parent node;
(e) calculating, by the processor, the required availability of nodes in the tree structure using the required availability value ascribed to the parent node as a basis for calculating the required availability of each node adjacent to the parent node by calculating the required availability of each adjacent node on the assumption that each adjacent node is equally reliable, and repeating the calculation until the required availability is calculated for a plurality of the nodes in the tree structure; and (f) outputting the calculated availability and the calculated required availability of the plurality of the nodes.

2. A method according to claim 1 further comprising repeating steps (a) to (f) for a plurality of variants of the system, each variant differing in at least one of the number of components, the type of components and the availability of components.

3. A method according to claim 2 further comprising manufacturing the system in accordance with one of the variants of the system.

4. A method according to claim 1 wherein the step of outputting the calculated availability and required availability includes comparing the calculated availability and calculated required availability and color coding the output depending on the result of the comparison.

5. A method according to claim 1 further comprising calculating at least one figure of merit other than the availability for the system and outputting the result.

6. A method according to claim 1, further comprising
compiling a transfer file defining a spreadsheet including cells representing the components, the cells including calculation cells; and
running the transfer file in the spreadsheet environment to create a spreadsheet including cells for the components representing the calculated availability and calculated required availability.

7. A method according to claim 6 wherein the transfer file is an extensible markup language file.

8. A method according to claim 6 wherein, when the system details define a specific plural number of like components, the step of compiling the spreadsheet includes creating a component count cell initially populated with that specific plural number, and creating a number of instances of the like components in the spreadsheet based on the number in the component count cell, so that a spreadsheet user may vary the number of components being modeled by varying the number in the component count cell.

9. A method according to claim 4 wherein the spreadsheet color codes the cells for a component depending on the ratio between the calculated required availability and the calculated availability.

10. A non-transitory computer readable medium upon which is embedded a computer program product, that when executed by a processor, calculates an availability of a system made up of components, said computer program product comprising:
(a) code for receiving system details regarding the components and an availability of the respective components, wherein the received availability of the respective components is associated with a total operating time without failure of the respective components which is expressed using at least one of a mean time to failure, a mean time to repair and a mean time to attend associated with the respective components;
(b) code for receiving system details defining the interrelationship of the components as having a tree structure of nodes with the system represented as a parent node, the components as component nodes, and intermediate nodes between the parent node and the component nodes, wherein the intermediate nodes represent groupings of component nodes;
(c) code for calculating the availability of the nodes in the tree structure using the received system details with the component nodes as bases for calculating the availability of the intermediate nodes and the parent node;
(d) code for receiving a required availability figure for the system and ascribing it to the parent node;
(e) code for calculating the required availability of nodes in the tree structure, using the required availability value ascribed to the parent node as a basis for calculating the required availability of each node adjacent to the parent node by calculating the required availability of each adjacent node on the assumption that each adjacent node is equally reliable, and repeating the calculation until the required availability is calculated for a plurality of the nodes in the tree structure; and
(f) code for outputting the calculated availability and the calculated required availability of the plurality of the nodes.

11. A non-transitory computer readable medium according to claim 10, further comprising:
(g) code for compiling a transfer file defining a spreadsheet including cells representing the components, the cells including calculation cells; and
(h) code for running the transfer file in the spreadsheet environment to create a spreadsheet including cells for the components representing the calculated availability and calculated required availability.

12. A non-transitory computer readable medium according to claim 11 wherein the transfer file is an extensible markup language file and the transfer file is arranged to define the spreadsheet.

13. Apparatus for designing a system by calculating an availability of the system made up of components, said apparatus comprising:
a processor, wherein the processor:
(a) receives system details regarding the components of the system and an availability of the respective components, wherein the received availability of the respective components is associated with a total operating time without failure of the respective components which is expressed using at least one of a mean time to failure, a mean time to repair and a mean time to attend associated with the respective components;
(b) receives system details defining the interrelationship of the components of the system as having a tree structure of nodes with the system represented as a parent node, the components as component nodes, and intermediate nodes between the parent node and the component nodes, wherein the intermediate nodes represent groupings of component nodes;
(c) calculates the availability of nodes in the tree structure using the received system details with the child component nodes as bases for calculating the availability of the intermediate nodes and the parent node;
(d) receives a required availability figure for the system and ascribing it to the parent node;
(e) calculates the required availability of nodes in the tree structure using the required availability value ascribed to the parent node as a basis for calculating the required availability of each node adjacent to the parent node by calculating the required availability of each adjacent node on the assumption that each adjacent node is equally reliable, and repeating the calculation until the required availability is calculated for a plurality of the nodes in the tree structure; and
(f) outputs the calculated availability and the calculated required availability of the plurality of the nodes.

14. Apparatus according to claim 13, wherein the processor compiles a transfer file defining a spreadsheet including cells representing the components, the cells including calculation cells; and the apparatus further comprising a spreadsheet program arranged to run the transfer file in the spreadsheet environment to create a spreadsheet calculating the availability and the required availability of the plurality of the nodes and to receive different system details in the spreadsheet environment and to recalculate the calculated availability and the calculated required availability of the plurality of the nodes.

15. Apparatus according to claim 14 wherein the transfer file is an extensible markup language file.

16. Apparatus according to claim 14 wherein the processor, when the system details define a specific plural number of like components, compiles the spreadsheet to include a component count cell initially populated with that specific plural number, and creates a number of instances of the like components in the spreadsheet based on the number in the component count cell, so that a spreadsheet user may vary the number of components being modeled by varying the number in the component count cell.

17. The method according to claim 1, wherein the calculated required availability of the component nodes is a measure of a total operating time without failure of the respective components associated with the component nodes and calculated using at least one of a mean time to failure, a mean time to repair and a mean time to attend associated with the respective components.

18. The non-transitory computer readable medium according to claim 10, wherein the calculated required availability of the component nodes is a measure of a total operating time without failure of the respective components associated with the component nodes and calculated using at least one of a mean time to failure, a mean time to repair and a mean time to attend associated with the respective components.

19. The apparatus according to claim 13, wherein the calculated required availability of the component nodes is a measure of a total operating time without failure of the respective components associated with the component nodes and calculated using at least one of a mean time to failure, a mean time to repair and a mean time to attend associated with the respective components.

* * * * *